United States Patent [19]

Burke et al.

[11] Patent Number: 5,492,594
[45] Date of Patent: Feb. 20, 1996

[54] CHEMICAL-MECHANICAL POLISHING TOOL WITH END POINT MEASUREMENT STATION

[75] Inventors: Peter A. Burke, Austin, Tex.; Eric H. Freeman, Underhill Center; Gilbert H. Ross, Burlington, both of Vt.

[73] Assignee: International Business Machines Corp., Armonk, N.Y.

[21] Appl. No.: 311,807

[22] Filed: Sep. 26, 1994

[51] Int. Cl.$^6$ .............................. B24B 1/00; B24B 37/00
[52] U.S. Cl. .................. 216/86; 437/8; 216/88; 451/286; 451/287; 451/28
[58] Field of Search .................. 156/627, 636; 437/8; 51/131.2, 131.3, 281 R

[56] References Cited

U.S. PATENT DOCUMENTS

| | | | |
|---|---|---|---|
| 4,793,895 | 12/1988 | Kaanta et al. | 156/627 |
| 4,995,939 | 2/1991 | Ferenczi et al. | 156/627 |
| 5,081,421 | 1/1992 | Miller et al. | 324/671 |
| 5,081,796 | 1/1992 | Schultz | 51/165.74 |
| 5,240,552 | 8/1993 | Yu et al. | 156/636 |
| 5,337,015 | 8/1994 | Lustig et al. | 156/627 X |

OTHER PUBLICATIONS

"Resistance/Capacitance Methods for Determining Oxide Etch End Point"; IBM Technical Disclosure Bulletin vol. 16 Jan. 1974 pp. 2706–2707.

Primary Examiner—Thi Dang
Attorney, Agent, or Firm—Thornton & Thornton; William D. Sabo

[57] ABSTRACT

This is a wafer polishing and planarizing tool in which there is incorporated a separate measuring station and means for moving the wafer and immersing the wafer into the measuring station without removing it from the polishing head. The wafer being treated is quickly, reliably and periodically checked over its entire surface to determine the thickness of any dielectric on its surface. The measuring station contains a plurality of measuring electrodes immersed in an electrolyte so that when the wafer to be measured is introduced into the station not only is the wafer surface cleaned of any slurry or other contaminants but simultaneously the measuring electrodes see a constant medium to provide multi-point thickness measurements across the entire wafer surface. Thus measurement variations due to pad or slurry conditions are eliminated.

11 Claims, 2 Drawing Sheets

CHEMICAL-MECHANICAL POLISHING TOOL WITH END POINT MEASUREMENT STATION

FIELD OF THE INVENTION

This invention relates generally to chemical mechanical planarization or polishing tools and end point measuring systems. More particularly, the invention relates to a chemical mechanical polishing tool having a unified endpoint measuring station built into the tool.

BACKGROUND OF THE INVENTION

Chemical mechanical planarization has been widely used in the semiconductor industry for smoothing, polishing or planarizing coating or layers on the surface of semiconductor wafers. This process has been used to achieve the planarization, the controlled reduction in thickness, or even the complete removable of such layers which may be, for example, an oxide on the surface of the semiconductor wafer.

Basically this chemical mechanical polishing process requires that the workpiece be held, with the coated surface face down, on a polishing pad supported on a rotating table, in the presence of an abrasive slurry. The slurry is comprised of a carrier liquid in which the abrasive is suspended. This carrier liquid is further selected to be an etchant for the coating being planarized without substantially attacking the other materials involved in the process. A typical chemical mechanical process is described in U.S. Pat. No. 4,910,155 assigned to the same assignee as the present invention.

Apparatus for such chemical mechanical polishing process is well known and used in the semiconductor industry and is currently commercially available.

In the semiconductor industry, it is often necessary that the coatings, being planarized or removed, have their thicknesses closely controlled so that underlying layers or coatings are not unnecessarily or adversely affected. It is therefore important that a method, known as endpoint detection, be provided to constantly measure the thickness of the coating being planarized so that the underlying layers remain unaffected.

Traditionally, lasers or other optical devices have been used to measure such thicknesses and determine when the desired endpoint has been reached. One such arrangement is shown in U.S. Pat. No. 5,081,796. In this patent the wafer is made to partially over hang the edge of the polishing table and a laser beam is directed at a point on the wafer surface and a measurement made. Because of machine configuration and because the wafer only partially over hangs the edge, such measurement is made only at a single point and thus does not provide sufficient information to reliably control the entire surface being polished. Furthermore the time that would be required to permit this apparatus to take the multiplicity of measurements needed for reliable control over the entire wafer surface is significant and expensive thus prohibiting its use in a production line.

Another technique involved the monitoring of the conductivity of the wafer during the polishing process by using a polishing pad having conductive electrodes embedded therein and measuring the current flow between the electrodes and metallic contact points provided in the surface of the wafer being polished. This approach is described in U.S. Pat. No. 4,793,895 which is also assigned to the present assignee.

Still another endpoint detection scheme, set forth in U.S. Pat. No. 5,081,421, is based on capacitively measuring the thickness of the dielectric on the surface of the wafer being polished by burying an electrode in the underlying polishing wheel. In actual practice the latter scheme attempts to provide a signal difference measurement that is correlated to the amount of coating material removed but does not provide the absolute value required to accurately determine the desired endpoint. This proposed method fails to achieve its promise because the physical and conductive characteristics and condition of both the pad and the slurry are constantly changing during the process. The pad changes not only because it wears but also because it becomes compressed and loaded with an increasing concentration of slurry and polishing debris. The slurry also changes because of chemical depletion and increasing loading with polishing debris. Furthermore because this process, by relying on the polishing slurry as a necessary conductive medium, is limited to slurries falling within a narrow PH range.

Thus there has continued a need for a stable, accurate, reliable and efficient method and apparatus for detecting the end point of a planarization or polishing method usable over a wide range of wafers and processes.

SUMMARY OF THE INVENTION

Accordingly it is an object of the invention to provide an apparatus and method which accurately, speedily, efficiently and reliably detects the thickness of a coating on the surface of a semiconductive wafer during the planarization process.

It is a further object of the invention to provide an apparatus and method which does not rely on special polishing pads or on the conductivity of the pads or slurries used while still accurately, speedily, efficiently and reliably measuring the thickness of a coating on the surface of a semiconductive wafer during the planarization process.

It is another object of the invention to provide a method and apparatus that can be used with a wide range of slurries and polishing conditions.

It is still another object of the invention to provide a method which will accommodate any variety of environments while providing uniform data necessary for proper process control.

These and other objects are realized in the present invention which provides a planarization apparatus and method for reliably and repeatability determining, in a single measurement step, the desired planarization endpoint of a coating over the entire surface of a semiconductor wafer. This is accomplished by providing the apparatus with a measuring station filled with a known electrolyte and a plurality of measuring electrodes and means for moving the wafer and immersing the wafer into the measuring station without removing it from the polishing head. The measuring station contains a plurality of measuring electrodes immersed in an electrolyte bath so that when the wafer, to be measured, is introduced into the station and contacts the measuring electrodes multi-point thickness measurements are made across the entire wafer surface.

The present invention by having a multi-electrode, electrolytic filled, measuring station built into the tool not only eliminates any variations in pad or slurry conditions but achieves, in a single step, a measurement of the condition of the coating across the entire wafer surface.

The present invention thus overcomes all the difficulties encountered with the prior art endpoint detectors.

These and other objects and features of the present invention will become further apparent from the following description taken in conjunction with the drawings.

DESCRIPTION OF THE PREFERRED EMBODIMENT

Figure 1:
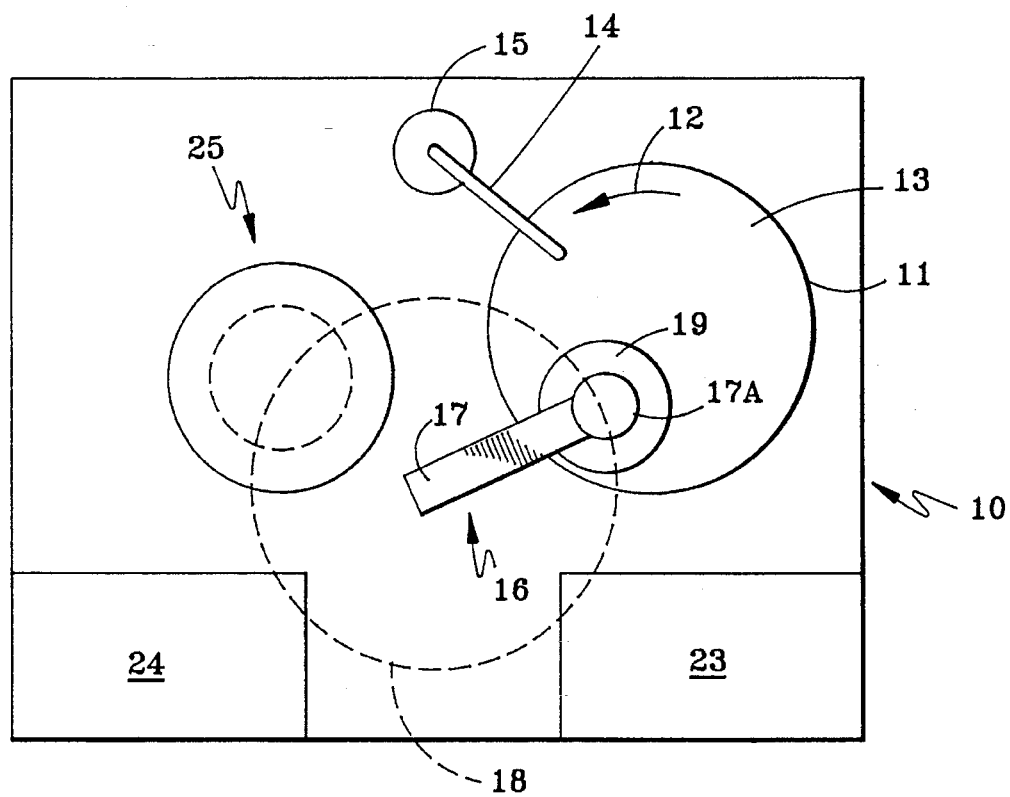
FIG. 1 is a top view of the planarizing apparatus of the invention.
Figure 2:
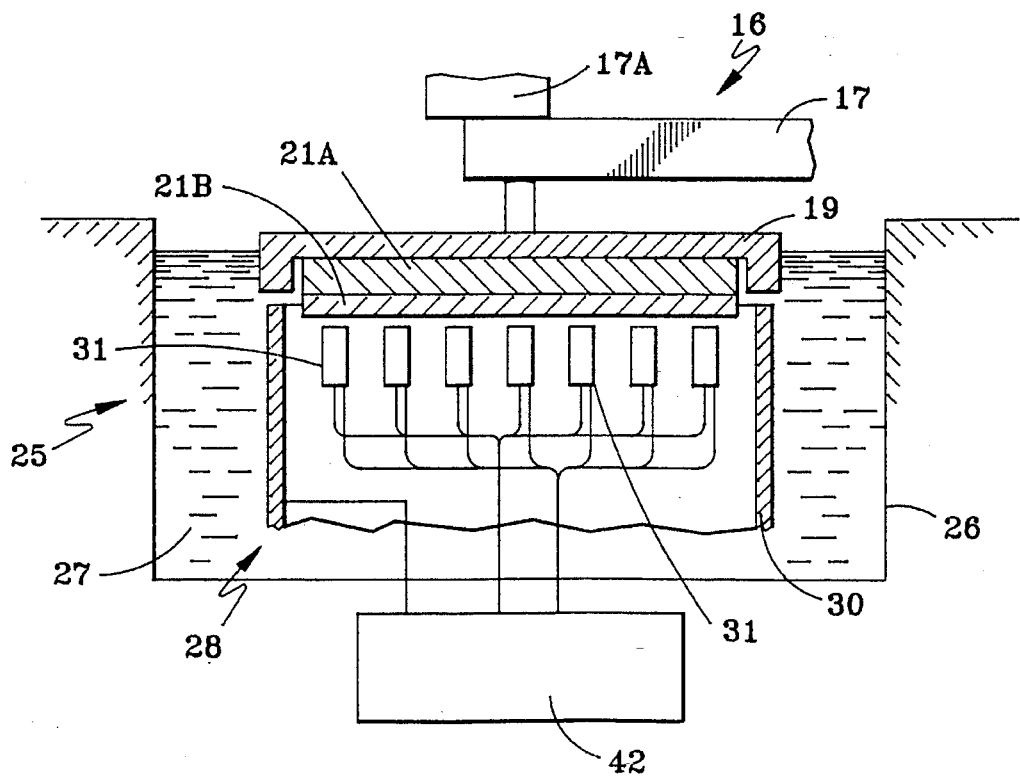
FIG. 2 is a side view of the measuring station of FIG. 1 with the quill assembly positioned over it.
Figure 3:
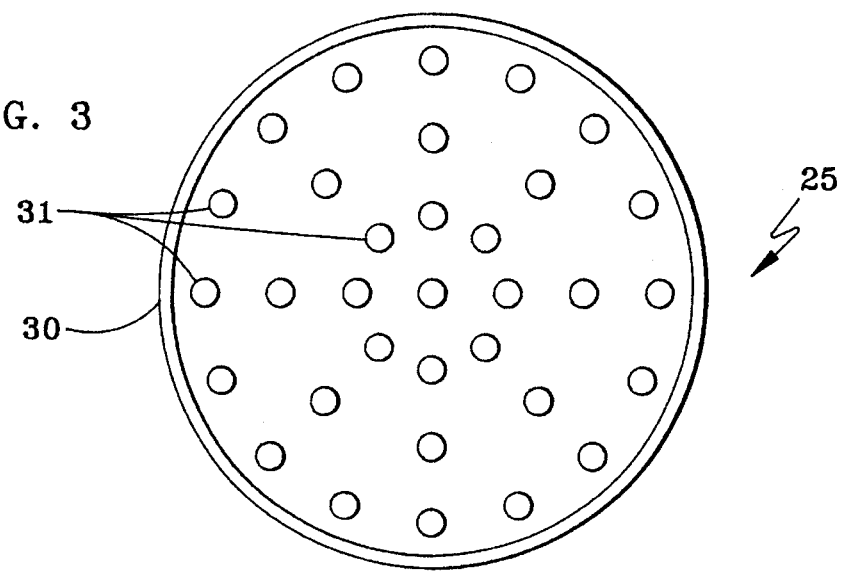
FIG. 3 is a top view of the electrode structure in the measuring station of FIG. 1.

Turning now to FIGS. 1 and 2 a wafer polishing or planarization apparatus 10 incorporating the present invention will be described. This apparatus includes a rotating polish wheel or platen 11 driven, in a counter clockwise direction as indicated by arrow 12, by a motor (not shown) and covered with a polishing pad 13. Around the periphery of the polish wheel there is usually a dam (not shown) for increasing the amount of slurry disposed on the pad 13 as taught by U.S. Pat. No. 4,910,155 which is assigned to the same assignee as the present invention. This slurry is dispensed on the pad by a suitable dispensing arm 14 which is connected to a slurry dispenser 15. The wafer 20 to be polished or planarized is held against the pad 13 by a quill assembly 16. This quill assembly includes a movable support arm 17 which can rotate 360 degrees in either direction, as indicated by the dotted circle 18. The arm 17 supports a motor 17a and carries a wafer pickup head 19 in the form of a shallow inverted cup adapted for picking up and holding the wafer 20. Each wafer 20 to be polished is picked up at a pickup station 23 and are unloaded at an unloading station 24. This pickup head 19 may be provided with any suitable means for holding the wafer. Two common ways of picking up and holding the wafers are by vacuum or by use of the Bernoulli principle. The pickup head 19 is rotated in a counter clockwise direction by the motor 17a and can contain an elastomeric pad (not shown) positioned between the pickup head 19 and the wafer 20. The wafer 20 is formed of a semiconductor body 21a and typically has disposed on one surface thereof one or more circuit layers (not shown for purposes of clarity) which are over coated with a thick dielectric coating, such as oxide layer 21b. It is this layer 21b which is planarized by the abrasive action between the spinning pickup head 19 and the spinning, slurry loaded, pad 13 on platen 11.

Since these polishers are widely known, commercially available, and used extensively in the semiconductor industry further discussion of their basic operation is unnecessary.

The equipment of the present invention has however been modified from that of the commercially available apparatus by the addition of a electronic measuring station 25. This station comprises a tank 26 filled with an appropriate electrolyte 27, such as PH buffered potassium hydroxide (KOH), and containing an electrode structure 28.

This electrode structure 28 is comprised of a surrounding field electrode 30 and a plurality of measuring electrodes 31 arranged generally in a radial configuration. The field electrode 30 has a diameter substantially equal to that of the pickup head 19 and thus is but slightly larger than the diameter of the wafer 20. The field electrode 30 and each of the measuring electrodes 31 is coupled to a signal processing apparatus 42. By sequentially measuring the capacitance of the oxide layer 21b, in the region adjacent each electrode, the thickness of the entire oxide layer 21b can be rapidly established. This signal processing apparatus thus quickly provides a map of the entire wafer oxide thickness. If desired this signal processing apparatus can also include a visual display of the measured values in any desired form by using computer techniques well known to the art.

Figure 4:
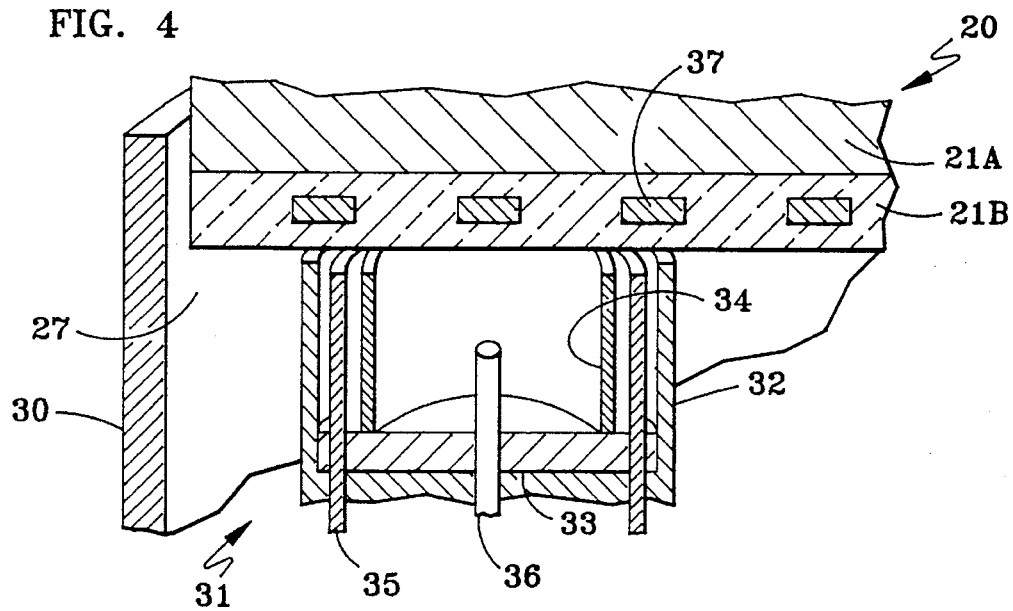
FIG. 4 is a partial sectional view of a portion of the wafer and one of the electrodes of the measuring station.
Figure 5:
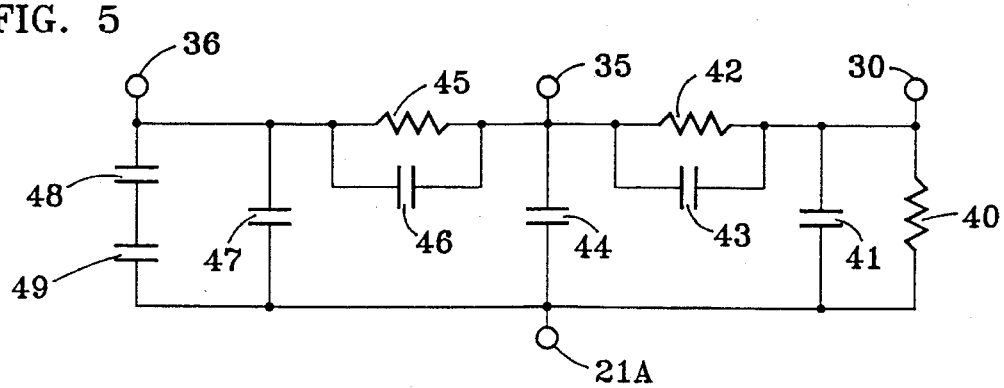
FIG. 5 is a schematic illustrating the electrical interaction characteristics of the wafer and the electrode structure of FIG. 4 when the wafer is in the measuring station.

With further reference now to FIGS. 4 and 5 the operation of the apparatus will be further described. Initially a wafer is picked up by the quill assembly 16 at a loading position 23. This is accomplished by rotating the quill assembly so that it is positioned over the loading station 23 and lowering the assembly 16 to pick up the wafer. Once the wafer 20 has been picked up the quill assembly is rotated along the dotted line 18 until it is located over the polishing wheel 11. Once it positioned over the pad 13 it is started spinning by motor 17a and lowered to force the layer 21b against the rotating polishing pad 13 upon which slurry is being dispensed. Polishing then begins and continues for a preselected time. At the end of the selected time the quill assembly lifts the wafer from the surface of the pad 13 while still spinning and moves the wafer to the measuring station 25 and aligns it with the electrode 28. This alignment may be controlled either electronically or by mechanical means. Once the head is aligned with the electrode 29 it is lowered into the electrolyte 27. Because the quill is raised from the surface of the layer while it is spinning most of the slurry is spun off the surface of the oxide layer 21b by centrifugal force. Preferably the spinning of the wafer is terminated before it reaches the electrolyte 27. If desired a rotating brush (not shown) can be moved across the surface of the wafer once it has been lifted but before it stop spinning to remove any slurry residue. If any slight residue of slurry still remains on the surface of the oxide layer 21b it will usually be so insignificant as to not appreciatively affect the measurement sine the electrolyte in the measuring station will tend to remove such slight residues. However, if one wishes, the spinning action can be continued as the wafer touches the surface of the electrolyte and thus the surface of the oxide layer 21b will receive an additional washing by the electrolyte. The non-rotating wafer is now forced down in the electrolyte until the surface of layer 21b contacts the submerged upper surfaces of the measuring electrodes 31.

Each of these measuring electrodes 31 are formed of a suitable insulating material such as rubber or plastic arranged as a double walled cavity having inner and outer coaxial walls 32 and 34. This cavity is formed by a hollow central inner shield wall 34 supported on a base 33. This inner wall 34 has, in one embodiment a diameter of 5.0 mm and is spaced from an outer shield wall 32 whose outer diameter is approximately 6.5 mm. Both the inner and outer walls 32 and 34 are supported on base 33 to form between them an extended annular cavity, open at the top, in which there is provided an extended tubular shield electrode 35. In the center of the electrode 31 there is positioned a central coaxial electrode 36. The shield electrode 35 and the coaxial electrode 36 both pass through and are supported by the base 33 and both are connected to the signal processing apparatus 32.

The inner and outer shield walls are important to the operation of the device for when the electrode 31 is placed against the oxide surface 21 as shown in FIG. 4 they prevent shorting between the electrodes 30, 35, and 36 by the surrounding electrolyte.

The electrodes 30, 35 and 36 are all connected to a signal processing apparatus which includes a source of voltage approximately 40 mV oscillating at a selected frequency of about 100 kHz while the semiconductive portion 21a of the wafer 20 is grounded through the pickup head 19.

During the application of the oscillating voltage to the wafer the electrical situation can be illustrated by the equivalent circuit shown in FIG. 5. In this circuit the field electrode 30 is coupled to the wafer 20 through resistor 40 and a capacitor 41 which represent the equivalent resistive and capacitive values of the electrolyte existing between the grounded portion 21a of the wafer 20 and the field electrode 30. Field electrode 30 is also coupled to the shield electrode 35 via resistance 42 and capacitor 43 which represent the resistance and capacitive values of any leakage paths caused by seepage of electrolyte between the field and shield electrodes 30 and 35 respectively. Because however there is provided a good seal between the surface of layer 21b and the inner and outer walls 32 and 34 each of these electrodes are for essentially isolated in their own electrolyte filled chambers and any seepage of the electrolyte across the top of these walls is so minimal that it can be ignored.

The shield electrode 35 is further coupled to the wafer 20 by a capacitor 44 which is representative of the capacitance between the shield electrode and the wafer 20.

Shield electrode 35 is also coupled to the coaxial central electrode 36 via resistance 45 and capacitor 46 which represent the resistance and capacitive values of any electrolyte seepage between the shield and central electrodes 35 and 36 respectively.

Finally the central electrode 36 is coupled to the semiconductor body 21a by a capacitor 47. When there is a metal layer 37 buried in the oxide layer additional serial capacitors 48 and 49 exist in parallel to capacitor 47 as shown here. Capacitor 48 is the capacitance existing between the central electrode 36 and the buried metal layer 37 while capacitance 49 is the capacitance existing between the metal layer 37 and the wafer 20. The value of capacitor 47 is representative of the thickness of the oxide layer and is the capacitance of interest from which the thickness of layer 21b is to be established.

As can be seen from this equivalent circuit the determinant measurements are made between the central and shield electrodes and the effect of the field electrode can for all practical purpose be ignored.

This determination is made by the signal processing circuit 32 which drives the central electrode with an alternating voltage from an oscillator so that a displacement current flows between the electrodes 35 and 36. The amplitude of this displacement current is measured, compared to a reference voltage and any difference therebetween is used to control the amplitude of the oscillator to hold the displacement current constant at a level where the difference is null. When this occurs the amplitude of the drive voltage is a direct measurement of the thickness of the oxide layer.

Each of the measuring electrode 31 can thus rapidly measure the thickness of the layer immediately adjacent each electrode. By making a large number of measurement over the entire surface of the wafer an accurate and reliable map of the oxide thickness on the surface of the wafer can be made. Once the measurement of the oxide thickness is made and it is found that the thickness has not yet reached the desired thickness or planarization the quill can be returned to the polishing pad and the polishing continued for a further selected amount of time. The above described series of polishing and measuring steps can thus continue until the desired endpoint is reached. When this occurs the quill is moved to the unloading station 24 where the planarized wafer is removed from the pickup head 19. The quill is then moved to the loading station 23, where a new wafer is loaded and the process described above can be again repeated for this new wafer.

While the invention has been particularly described with respect to a preferred embodiment and variations thereon, it should be understood that one skilled in the art can, from the foregoing, readily make further changes in form and detail without departing from the spirit and scope of the invention.

What is claimed is;

1. A process for polishing the surface of a wafer having a dielectric layer on a surface thereof comprising:

holding the wafer in a rotatable pickup head;

rotating the wafer in said head and holding said wafer against a slurry pad disposed on a polishing platen;

lifting said the wafer in said head from said platen;

cleaning said slurry from the wafer surface; and placing said wafer into a fluid filled measuring station and in contact with a plurality of measuring electrodes in said station for measuring the thickness of any dielectric remaining on said wafer surface.

2. In a semiconductor wafer polishing apparatus for planarizing a thin dielectric layer on a semiconductor wafer comprising:

polishing means including a rotating polishing platen with abrasive slurry disposed thereon;

a rotating polishing chuck for holding said wafer; and a measuring station adjacent said polishing means comprising a tank containing a fluid electrolyte, a field electrode, and a plurality of measuring electrodes positioned within said field electrode.

3. The apparatus of claim 1 wherein said chuck has a given diameter, is formed of a conductive material and provided with means for holding said dielectric layer on said wafer against the platen and for moving said wafer across said platen.

4. The apparatus of claim 1 wherein the field electrode has a diameter substantially equal to the diameter of the chuck.

5. The apparatus of claim 2 wherein the field electrode and the measuring electrodes are immersed in said electrolyte.

6. The apparatus of claim 1 wherein the measuring electrodes are radially arranged within said field electrode.

7. The apparatus of claim 1 wherein each measuring electrode comprises:

a double walled cup having coaxial inner and outer separated shield walls mounted on a circular base;

a central electrode passing through said base and coaxial with said walls: and a tubular shield electrode mounted between said inner and outer walls.

8. The apparatus of claim 7 wherein said base and said walls are formed of an insulating material and said outer shield wall insulates said shield electrode from said field electrode and said inner shield wall insulates the central electrode from said central electrode.

9. The apparatus of claim 7 wherein said base and said walls are formed of an insulating material.

10. The apparatus of claim 8 wherein said central electrode, said shield electrode and said field electrode are all coupled to a signal processing apparatus.

11. The apparatus of claim 1 wherein said electrolyte comprises a buffered solution of Potassium Hydroxide.

\* \* \* \* \*